United States Patent [19]

Smith

[11] Patent Number: 4,778,394

[45] Date of Patent: Oct. 18, 1988

[54] PLUGGABLE ELECTRONIC CARTRIDGE EXTRACTOR

[75] Inventor: John F. Smith, Lexington, Ky.

[73] Assignee: International Business Machines Corporation, Armonk, N.Y.

[21] Appl. No.: 944,686

[22] Filed: Dec. 19, 1986

[51] Int. Cl.⁴ .............................................. H05K 1/00
[52] U.S. Cl. ...................................... 439/59; 439/476; 439/160
[58] Field of Search .................. 339/45, 46, 91 R, 75, 339/17, 176 MP, 74, 125 R, 119 R, 108

[56] References Cited

U.S. PATENT DOCUMENTS

| | | |
|---|---|---|
| 3,801,757 | 4/1974 | Carissimi et al. ................. 339/45 M |
| 3,944,311 | 3/1976 | Sprenkle et al. ................. 339/45 M |
| 4,128,288 | 12/1978 | Zachry et al. ................. 339/75 MP |
| 4,638,405 | 1/1987 | Smith ................................ 339/45 M |

Primary Examiner—David Pirlot
Attorney, Agent, or Firm—Laurence R. Letson

[57] ABSTRACT

The cartridge disclosed is provided with an extractor means which is instrumental in the removal of the cartridge from the machine, by providing a smooth camming action to move the cartridge away from the machine circuit board. The extractor allows the cartridge to protrude only a small amount outside the machine housing and still be removed such that the cartridge is not rocked or moved to and fro relative to the machine circuit board.

8 Claims, 2 Drawing Sheets

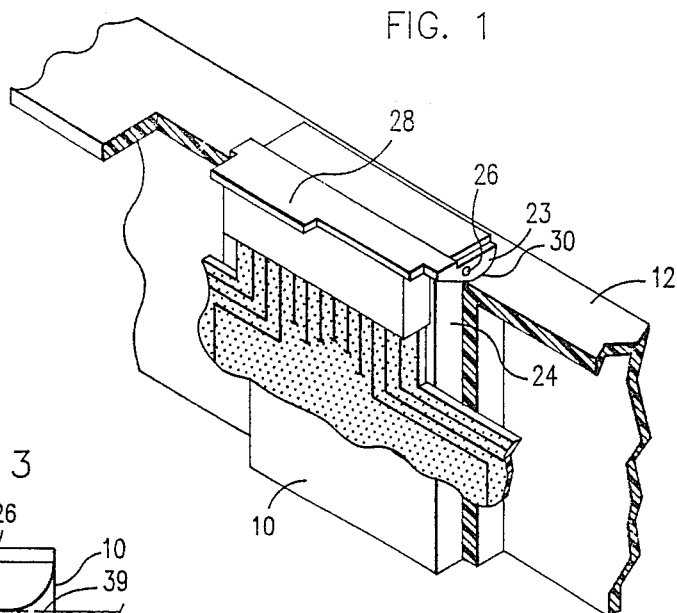
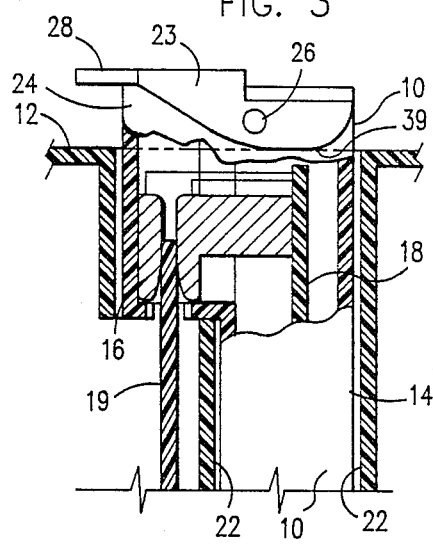
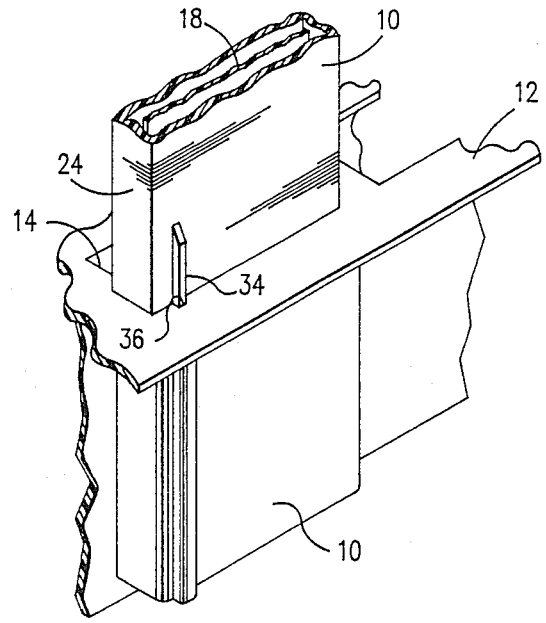

PLUGGABLE ELECTRONIC CARTRIDGE EXTRACTOR

This invention relates to pluggable electronic cartridges used in typewriters and computers. More specifically, the invention relates to an extraction apparatus for pulling the cartridge connector from the electronic board of the host device

BACKGROUND OF THE INVENTION

As electronic typewriters become more sophisticated and provide ever increasing function, the products are following the lead of personal computers in that the functions or features may be added to the basic typewriter by the attachment of an auxiliary device which contains the necessary code to control the typewriter in the desired manner.

The approaches that have been followed in adding function to typewriters includes the use of dedicated circuit boards which are contained within an enclosure which is then attached to the typewriter both electronically and physically. This approach is cumbersome and limits the operator to a few optional functions.

Computers and more recently typewriters have begun using cartridges for the addition of function and memory capacity. The cartridges are connected to the electronics of the typewriter or computer by engaging a connector and a land pattern of a circuit board. To insure adequate contact between the connector and the lands, the connector exerts a significant force on the land when the connection is made. This force also serves to impede the removal of the connector. The natural tendency of the operator is to insert and remove the cartridge by rocking the cartridge relative to the circuit board of the machine. This is undesirable, particularly with cartridges which require that the electronic circuitry be electrically grounded prior to making the functional connections, since the ground protection is typically designed for a straight push insertion, and extraction.

Additionally, it is desirable from a design standpoint, to have the cartridge contained within the machine housing as much as possible. This not only makes the appearance of the machine more pleasing, but also minimizes the possibility of causing a machine malfunction through undesired impact of the cartridge.

The desired low profile or minimal exposure of the cartridge requires that only a minimum of the cartridge be exposed to the grip of the operator and thus hinders the extraction of the cartridge due to the small grip area and the relatively high engaging force exerted by the connector on the circuit board lands.

U.S. Pat. No. 1,900,782 to C. M. May discloses a light plug which has a bellcrank lever movable by a person's thumb to pull the plug from the electrical wall socket. This device, while well suited for the environment in which it is used, exerts a force well off the center of the plug blades and actually tend to induce rocking or tilting of the plug, which in the present environment is very undesirable, as described above.

SUMMARY OF THE DISCLOSURE

The present invention is a cartridge with either a circuit board land pattern or a connector on the circuit board exposed through an opening in the cartridge housing. Attached to the cartridge housing near the extremity that will remain exterior to the machine housing is a device for assisting the operator in the extraction of the cartridge from the machine housing. The extractor comprises a handle which in turn is connected to at least a camming surface oriented in such a way as to engage the machine housing, when pivoted. The cam surface is defined so as to engage the machine housing at a fixed point to effect extraction of the cartridge from the connection with the electronic circuit of the machine.

The handle is grasped by the operator and rotated to drive the camming member around its pivot axis and in so doing, the cartridge is force upward and outward from the machine housing. The line of force exerted on the cartridge by the cam members is such that the connector is disconnected from the circuit board without exerting a rocking or twisting motion.

DRAWING

FIG. 1 illustrates the cartridge positioned within the machine housing.

FIG. 2 illustrates a portion of the cartridge partially withdrawn from the machine housing, and showing the keying arrangement necessary to control undesired interchangeability of cartridges.

FIG. 3 is a section view of the cartridge and machine housing.

DETAILED DESCRIPTION OF THE INVENTION

The cartridge 10 is the type of pluggable cartridge in which the program or software for a particular function or feature of a typewriter or computer may be packaged or which may contain additional memory capacity. The cartridge 10 is insertable into the machine housing 12 which has a cavity or sleeve 14 formed to guide the cartridge 10 during insertion and extraction.

Figure 4:
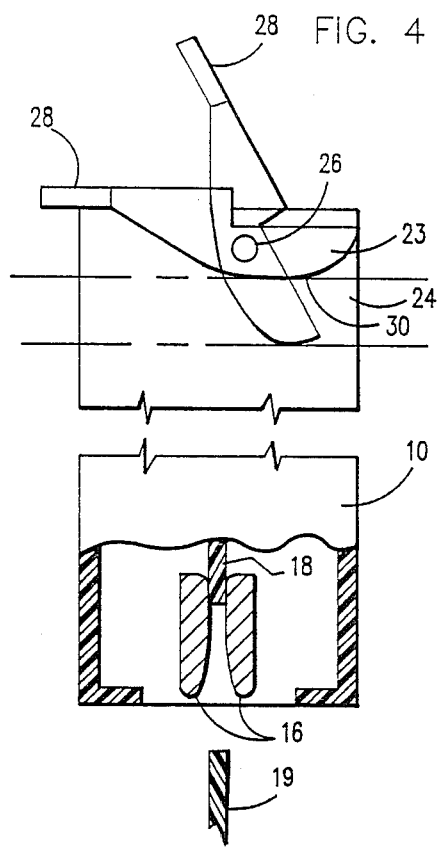
FIG. 4 illustrates the cam profile and the relation of the cam with machine housing at the point of engagement.
Figure 5:
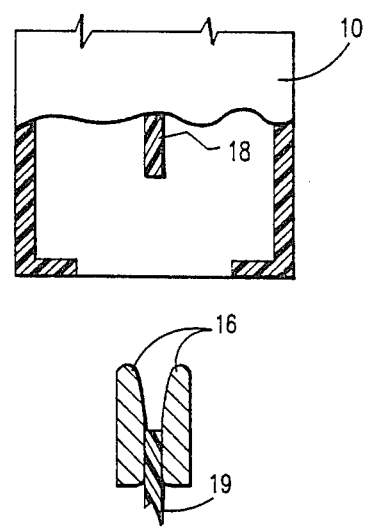
FIG. 5 illustrates the cartridge of the invention with the edge connector exposed through an opening in the cartridge for mating with the edge connector of the machine.

The cartridge 10 may be provided with a connector 16 which is exposed to the exterior of the cartridge 10 or alternatively the circuit board 18 contained within the cartridge 10 may have a pattern of lands that will mate with a connector 16 as shown in FIG. 5. There is no significance to the choice of the location of the connector 16.

The sleeve 14 of the machine housing 12 comprises a plurality of wals or slide surfaces 22 which act to constrain the cartridge 10 except in a direction which would permit insertion or extraction. The sleeve 14 may be keyed by means of a channel or some other irregularity 36 which will permit the insertion of a cartridge 10 with a complimentary irregularity 34.

When the cartridge 10 is fully inserted as is the case in FIG. 1, the top of the cartridge 10 protrudes only slightly above the machine housing 12, providing only a small portion of the cartridge 10 to be grasped.

In order to extract the cartridge 10 from the machine housing 12, and at the same time insure that the cartridge is not deflected or pushed to one side or the other with possible attendant electrical or physical damage to the circuit or the circuit board 18 or 19 and connector 16, it is desirable to pull the connection between the connector 16 and the mating circuit board 19 or 18 so that the direction of movement is parallel to the plane of the circuit board 18 or 19 and perpendicular to the connection edge of the circuit board 18 or 19.

Connectors 16 of the edge connector type illustrated require a relatively large force to ensure both physical and electrical engagement. Overcoming such force with a small gripping area can be further compounded by the fact that many operators may have long fingernails which will interfere with the securing of a good grip on the cartridge 10.

In order to easily extract the cartridge 10, and to insure that the extraction force was exerted in the desired plane, a camming member 23 is pivotally mounted on the cartridge, on the cartridge sides 24. The pivot 26 supports the camming member 23 so as to allow the rotation of the camming member 23 and the exertion of a force against the machine housing 12.

The increasing radius cam profile 30 of the camming member 23 is configured to have a constant point of engagement on the machine housing. The constant point of engagement 39 prevents the shifting of the forces and a resulting rocking or twisting of the cartridge 10, relative to the circuit board 18 within the machine housing 12. As the camming member 23 is rotated to create an extraction force on the cartridge 10, the radius or rise of the cam profile 30 increases at such a rate as to maintain the point of engagement 39 in a constant position as described above.

The camming member 23 is rotatable by exerting an upward force on handle 28 which extends from the camming member 23 and across the width of the cartridge 10, thus interconnecting the essentially identical camming members 23 on each side of the cartridge 10. The use of dual camming members 23 insures that the force exerted on the cartridge 10 will be balanced on pivots 26 on both sides of the cartridge 10.

The cartridge 10 may be one where it should only be inserted into a designated sleeve and in those instances, may be keyed with a ridge 34 or other similar surface irregularity. The ridge 34 or alternative surface irregularity may be referred to as key 34. The key 34 is configured to mate with a complimentary shape such as a slot 36 in the sleeve 14. Unless the key 34 and the slot 36 match and the key 34 enters the slot 36, the cartridge 10 cannot be inserted into the machine housing 12.

The cartridge 10 is inserted into the machine housing 12 by introducing the cartridge 10 into the sleeve 14 and pushing. Movement of cartridge 10 into sleeve 14 brings connector 16 into engagement with the circuit board 19 or 18. The sleeve 14 acts to prevent the cartridge 10 from being rocked to ease the connection to the circuit board 19 or 18 within the machine housing 12.

Should the operator desire to remove the cartridge 10 from the machine housing 14, the handle 28 is grasped and lifted to rotate the camming members 23 forcing the cam profiles 30 of the camming members 23 against the machine housing 12. The engagement point between the camming devices 23 and the machine housing 12 remains at a constant point on the machine housing 12, thereby insuring a constant directional force exerted to cause the extraction of the cartridge 10 and disconnection of the cartridge 10 from the circuit board 19 contained within the machine housing 12. The constant engagement point on the machine housing 12 prevents a deflection of the cartridge 10 and the attendant risk of damaging either the circuitry on board 18 of the cartridge 10 or the circuitry on board 19 contained in the machine housing 12.

The handle 28 and the camming members 23 on the cartridge 10 eliminate the need for a substantial portion of the cartridge 10 to be exposed above the machine housing 12 for gripping purposes.

I claim:

1. An electronic cartridge having walls enclosing electronic circuitry; an aperture through at least one of said walls of said cartridge for connecting said circuitry to electronic components exterior to said cartridge; extraction means for aiding in disconnecting said electronic circuitry from said electronic components, said extraction means comprising at least a cam means, having a pivot axis fixed with respect to said cartridge and pivotally mounted on the exterior of said cartridge, said cam means comprising a cam surface profile of increasing radius for engagement with a follower surface, thereby defining an engagement point on said cam surface profile, whereby the engagement point of said cam surface profile with said follower surface remains, relative to said electronic circuitry, within a plane parallel to the movement of said circuitry and within a plane parallel to said pivot axis during said disconnecting, during the effective pivoting of said cam means.

2. The electronic cartridge of claim 1, wherein said means for connecting said electronic circuitry further comprises a female circuit board edge connector positioned within said cartridge and proximate said aperture, for engagement with a circuit conductor pattern on a circuit board exterior to said cartridge.

3. The electronic cartridge of claim 2, wherein said means for connecting said electronic circuitry further comprises a female circuit board edge connector positioned within said cartridge and proximate said aperture, for engagement with a circuit conductor pattern on a circuit board exterior to said cartridge.

4. The electronic cartridge of claim 1, wherein said means for connecting said electronic circuitry further comprises a circuit conductor pattern on said electronic circuitry positioned within said cartridge and proximate said aperture, for engagement with a female circuit board edge connector on a circuit board exterior to said cartridge.

5. The electronic cartridge of claim 1, wherein said means for connecting said electronic circuitry further comprises a circuit conductor pattern on said electronic circuitry positioned within said cartridge and proximate said aperture, for engagement with a female circuit board edge connector exterior to said cartridge.

6. The electronic cartridge of claim 1 wherein said extraction means further comprises a manually engageable handle means associated with said cam means to move said means.

7. The electronic cartridge of claim 6, wherein said means for connecting said electronic circuitry further comprises a female circuit board edge connector positioned within said cartridge and proximate said aperture, for engagement with a circuit conductor pattern on a circuit board exterior to said cartridge.

8. The electronic cartridge of claim 6, wherein said means for connecting said electronic circuitry further comprises a circuit conductor pattern on said electronic circuitry positioned within said cartridge and proximate said aperture, for engagement with a female circuit board edge connector on a circuit board exterior to said cartridge.

* * * * *